US011906585B2

(12) United States Patent
Reddy et al.

(10) Patent No.: US 11,906,585 B2
(45) Date of Patent: Feb. 20, 2024

(54) METHODS AND SYSTEMS FOR PERFORMING BUILT-IN-SELF-TEST OPERATIONS WITHOUT A DEDICATED CLOCK SOURCE

(71) Applicant: SAMSUNG ELECTRONICS CO., LTD., Suwon-si (KR)

(72) Inventors: A Santosh Kumar Reddy, Karnataka (IN); Gunjan Mandal, Karnataka (IN); Parin Rajnikant Bhuta, Karnataka (IN); Raghavendra Molthati, Karnataka (IN); Saikat Hazra, Karnataka (IN); Sanjeeb Kumar Ghosh, Karnataka (IN); Sunil Rajan, Karnataka (IN); Krupal Jitendra Mehta, Karnataka (IN); Praveen S Bharadwaj, Karnataka (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 22 days.

(21) Appl. No.: 17/657,659

(22) Filed: Apr. 1, 2022

(65) Prior Publication Data
US 2023/0194608 A1     Jun. 22, 2023

(30) Foreign Application Priority Data
Dec. 16, 2021     (IN) ............................. 202141058812

(51) Int. Cl.
*G01R 31/3187*     (2006.01)
*G01R 31/317*     (2006.01)

(52) U.S. Cl.
CPC ... *G01R 31/3187* (2013.01); *G01R 31/31724* (2013.01)

(58) Field of Classification Search
None
See application file for complete search history.

(56) References Cited

U.S. PATENT DOCUMENTS 7,822,110 B1 * 10/2010 Doblar ..................... H04B 3/32
                                                    375/226
9,076,366 B2     7/2015 Talwalkar et al.
(Continued)

FOREIGN PATENT DOCUMENTS

CN     103364714     10/2013

OTHER PUBLICATIONS

I. Robertson, G. Hetherington, T. Leslie, I. Parulkar and R. Lesnikoski, "Testing high-speed, large scale implementation of SerDes I/Os on chips used in throughput computing systems," IEEE International Conference on Test, 2005., Austin, TX, USA, 2005, pp. 8-pp. 999, doi: 10.1109/TEST.2005.1584065. (Year: 2005).*

*Primary Examiner* — Daniel F. McMahon
(74) *Attorney, Agent, or Firm* — F. CHAU & ASSOCIATES, LLC

(57) ABSTRACT

Built-in-self-test (BIST operations are performed by receiver lanes of a multilane receiver system, wherein at least one receiver lane is configured as a synthesized clock source for other receiver lanes configured to perform BIST operations. The at least one receiver lane configured as the synthesized clock source may generate a clock signal and provide the clock signal to the other receiver lanes performing the BIST operations. In some examples, digital control signals may be used for coordinating the enablement of the at least one receiver lane to function as the synthesized clock source and for coordinating the enablement of the other receiver lanes to perform BIST operations.

20 Claims, 5 Drawing Sheets

(56) References Cited

U.S. PATENT DOCUMENTS

| | | | |
|---|---|---|---|
| 9,100,112 B1* | 8/2015 | Leong | G06F 11/27 |
| 9,209,966 B1 | 12/2015 | Hossain et al. | |
| 9,419,786 B2 | 8/2016 | Lin et al. | |
| 9,577,816 B2 | 2/2017 | Hossain et al. | |
| 9,768,947 B2 | 9/2017 | Hossain et al. | |
| 11,424,905 B1* | 8/2022 | Musoll | H04L 7/0041 |
| 2004/0264612 A1* | 12/2004 | Allen | H03L 7/00 375/354 |
| 2006/0181956 A1* | 8/2006 | Gregorius | G11C 7/1093 365/194 |
| 2010/0095166 A1* | 4/2010 | Krepner | H04L 43/50 714/704 |
| 2012/0230373 A1* | 9/2012 | Hennedy | H04L 25/4908 375/219 |
| 2013/0294490 A1* | 11/2013 | Chandrasekaran | H04L 7/0083 375/226 |
| 2015/0063377 A1* | 3/2015 | Shui | G06F 1/10 370/517 |
| 2016/0329090 A1* | 11/2016 | Gans | G11C 11/4096 |
| 2017/0220517 A1* | 8/2017 | Khan | H04B 1/40 |
| 2017/0373944 A1* | 12/2017 | Lackey, Jr. | H04L 43/50 |
| 2019/0103956 A1* | 4/2019 | Meninger | H04L 27/2272 |
| 2019/0354495 A1* | 11/2019 | Lu | G06F 13/20 |
| 2019/0385498 A1* | 12/2019 | Murakami | G09G 5/006 |

\* cited by examiner

METHODS AND SYSTEMS FOR PERFORMING BUILT-IN-SELF-TEST OPERATIONS WITHOUT A DEDICATED CLOCK SOURCE

CROSS-REFERENCE TO RELATED APPLICATIONS

This application claims priority to, and the benefit of, Indian Application Serial No. 202141058812 filed on Dec. 16, 2021, entitled METHODS AND SYSTEMS FOR PERFORMING BUILT-IN-SELF-TEST OPERATIONS WITHOUT A DEDICATED CLOCK SOURCE. The entire contents of the foregoing application are hereby incorporated by reference for all purposes.

TECHNICAL FIELD

Embodiments of the present disclosure herein relate to the performance of Built-In-Self-Test (BIST) operations, and more particularly to systems and methods for performing BIST operations in multilane receiver systems, wherein receiver lanes of the multilane receiver systems act as synthesized clock sources.

BACKGROUND

Existing receiver systems utilize Phase Locked Loop (PLL) or Phase Interpolator (PI) based Clock Data Recovery (CDR) architecture, to recover a clock signal from a received data stream. Thereafter, the recovered clock signal is utilized the sample data bits in the received data stream. The receiver system is configured to track the frequency components of the data stream and the phase relation of the data stream to generate (e.g. recover) the clock signal. The receiver signal is aware of the frequency (bit rate/symbol rate) of the data stream (e.g., the frequency at which the data stream was transmitted by the transmitter). The CDR can be used for adjusting the phase of the data stream. In PLL-based CDR architecture, a clock pattern is sent initially for CDR locking. Once the clock signal is generated, phase difference between the clock signal and the data stream can be adjusted to sample data bit/sample at the center of the bit/sample period (as amplitude and Signal-to-Noise (SNR) is likely to be highest at the center of the bit/sample period).

A System-on-Chip (SoC) includes multiple transmitter systems and receiver systems. In an example, the receiver systems can be Serializer/Deserializer (SerDes) receiver systems. The SoC can have a reference clock (Ref Clock). The Ref Clock can be of a particular frequency. In general, the Ref Clocks are considered as low-frequency clock signals. In an example, the Ref Clock can be generated using a crystal and can be referred to as XTAL Ref Clock. There can be multiple Ref Clocks (corresponding to the various transmitter and receiver systems in the SoC). The transmitter and receiver systems utilize respective Ref Clocks to transmit, receive, and process data. As the receiver systems having PLL-based CDR architectures (with CDR locked) receive a clock pattern, the receiver systems can be independent of the Ref Clocks. Therefore, the need to generate Ref Clocks does not arise.

The functionality of the transmitter systems and the receiver systems in the SoC can be validated using a Built-In-Self-Test (BIST) feature. The BIST feature can be included in the various transmitter and receiver systems. For example, the BIST feature in a SerDes receiver system can enable the transmission of BIST test data patterns (using an internal transmitter). The BIST test data patterns are received internally (within the SerDes receiver system). The received data patterns can be compared with the transmitted BIST test data patterns. If the received data patterns match transmitted BIST test data patterns, the functionality (ability to receive) of the SerDes receiver system can be validated.

The BIST feature included in a receiver system utilizing PLL/PI may be based on CDR architectures that generate a clock. The clock can be used by the internal transmitter in the receiver system for generating test data patterns (for validating the functionality of the receiver system). For example, a test data sequence is generated based on a test data pattern and a received TX clock. The generation of the clock signal includes dedicated hardware equipment (such as a synthesized clock source) in the receiver system. For example, a 14 nm V-by-One Receiver (used in display panels) utilizes a dedicated PLL (acting as the synthesized clock source) for performing BIST operation, (generating the clock to generate the test data patterns for testing the functionality of the receiver system).

Further, the receiver system has to ensure that the frequency of the generated clock follows the data rate at which the receiver system is likely to receive actual data. The inclusion of synthesized clock source in the receiver system cannot be avoided as the data rate of actual received data is likely to be significantly higher than the clock frequency (clock rate) of the Ref Clocks of the receiver system. For example, the clock frequency of the Ref Clocks is close to 27 MHz, whereas the receiver system is likely to receive data streams at data rates of 6 Gbps. Therefore, the receiver system may generate a (high frequency) clock signal.

The synthesized clock source (such as the PLL, which includes ring oscillators and inductor-capacitor (LC) oscillators or tank oscillators) may be utilized by the receiver system only when the BIST operation is performed, i.e., the functionality of the receiver system (to receive data) is tested. The synthesized clock source may not be utilized when the receiver system is functioning as a normal receiver (receiving actual data). The synthesized clock source can consume a significant SoC area, increase overall power consumption of the SoC, and provide additional supply bumps in the SoC (which are connected to pins).

SUMMARY

Accordingly, the embodiments of the present disclosure provide methods and systems for enabling a multilane receiver system, comprising of a plurality of receiver lanes to perform Built-In-Self-Test (BIST) operations without using dedicated clock sources. Embodiments of the present disclosure enable at least one receiver lane, amongst the plurality of receiver lanes to acts as a synthesized clock source for other plurality of receiver lanes performing the BIST operations. The receiver lanes can operate in two modes (e.g., a functional mode and a BIST mode). In the functional mode, the embodiments of the present disclosure configure the receive lane to receive data streams from transmitters. In the BIST mode, the functionality of the receiver lanes (to accurately receive data streams) is tested by performing the BIST operations.

In an embodiment of the present disclosure, the receiver lane generates a test data pattern. The test data pattern is provided to components of the receiver lane functioning as an internal transmitter. The test data pattern is transmitted using a clock signal, which may be generated by another receiver lane of the receiver system. In an embodiment of the present disclosure, a data pattern can be received by at least one component in the receiver lane with data receiving functionality. The embodiments of the present disclosure include comparing the received data pattern with the test data, which was initially generated by the receiver lane. If it is determined that the received data pattern is matching the transmitted test data pattern, the embodiments of the present disclosure include verifying the functionality of the receiver lane to accurately receive data streams.

In an embodiment of the present disclosure, at least one receiver lane can be configured to act as a synthesized clock source. The receiver lane, acting as the synthesized clock source, can provide the clock signal to the other plurality of receiver lanes. The at least one receiver lane can be configured to act as a synthesized clock source when the other plurality of receiver lanes are performing the BIST operations. In an embodiment of the present disclosure, a receiver lane acting as the synthesized clock source can be adjacent to at least one receiver lane performing BIST operations. The configuration of the at least one receiver lane to function as the synthesized clock source, and the configuration of the other plurality of receiver lanes to perform the BIST operations, by utilizing the clock signal provided by the at least one receiver lane, can be managed using digital signals.

These and other aspects of the embodiments of the present disclosure will be better appreciated and understood when considered in conjunction with the following description and the accompanying drawings. It should be understood, however, that the following descriptions, while indicating embodiments and numerous specific details thereof, are given by way of illustration and not of limitation. Many changes and modifications may be made within the scope of the embodiments of the present disclosure without departing from the spirit thereof, and the embodiments of the present disclosure include all such modifications.

BRIEF DESCRIPTION OF FIGURES

Embodiments of the present disclosure are illustrated in the accompanying drawings, throughout which like-reference letters indicate corresponding parts in the various figures. The embodiments of the present disclosure will be better understood from the following description with reference to the drawings, in which.

DETAILED DESCRIPTION

Figure 1:
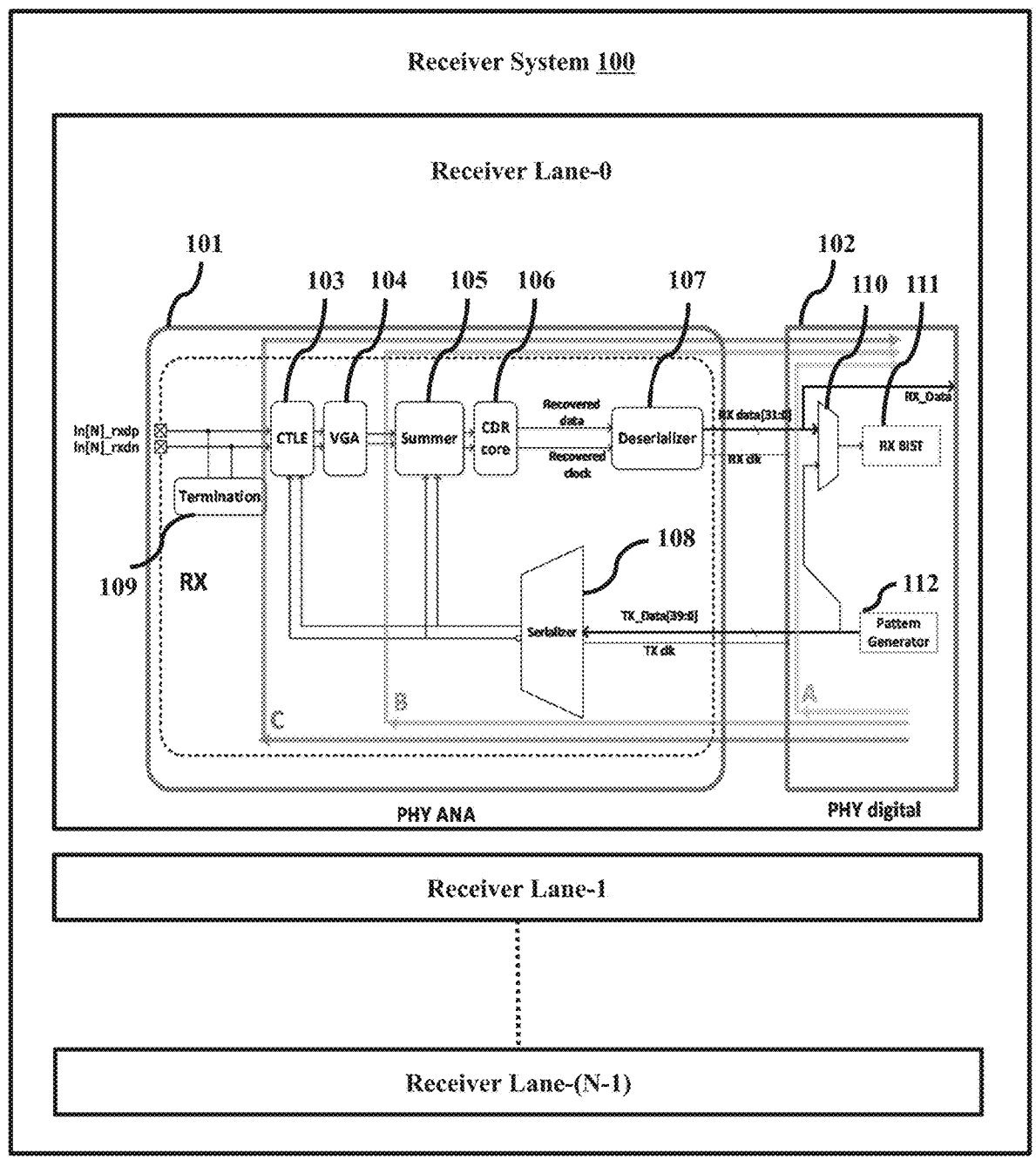
FIG. 1 depicts a receiver lane of a receiver system configured to perform Built-In-Self-Test (BIST) operations, wherein at least one receiver lane of the receiver system can function as a synthesized clock source to other receiver lanes of the receiver system performing BIST operations, according to embodiments of the present disclosure as disclosed herein.

The present disclosure relates generally to the performance of Built-In-Self-Test (BIST) operations. More particularly the present disclosure relates to systems and methods for performing BIST operations in multilane receiver systems.

In some embodiments, the present disclosure provides systems and methods for enabling a receiver system, comprising of a plurality of receiver lanes, to perform BIST operations. In some aspects, at least one receiver lane (e.g., of the plurality of receiver lanes) acts as a synthesized clock source for other receiver lanes performing the BIST operations. For instance, clock signals may be received from the synthesized clock source, which may enable the other receiver lanes to perform the BIST operations without incorporating dedicated clock sources.

Embodiments of the present disclosure configure at least one receiver lane of the receiver system to function as a synthesized clock source for at least one other receiver lane of the receiver system. The at least one receiver lane that functions as the synthesized clock source provides a transmitter (TX) clock to the at least one other receiver lane, where the TX clock can provide (e.g., or indicate) jitter/timing properties of the at least one other receiver lane (e.g., for performing one or more BIST operations).

Embodiments of the present disclosure may control the enablement of the at least one receiver lane of the receiver system to function as a synthesized clock source with respect to enablement of the at least one other receiver lane to perform BIST operation. In some aspects, the enablement of the at least one receiver lane to function as a synthesized clock source control and the enablement of the at least one other receiver lane to perform BIST operation can be controlled using digital signals.

According to techniques described herein, BIST operations may be performed by a subset of one or more receiver lanes (e.g., of a multilane receiver system), where at least one other receiver lane acts as synthesized clock source for the subset of receiver lanes performing the BIST operations. The at least one receiver lane acting as the synthesized clock source may generate a clock signal and provide the clock signal to the subset of receiver lanes performing the BIST operations. Accordingly, the at least one receiver lane acting as the synthesized clock source may enable the subset of receiver lanes to perform BIST operations. Digital control signals may be used for coordinating the enablement of the at least one receiver lane to function as the synthesized clock source and for coordinating enablement of the other receiver lanes (e.g., the subset of receiver lanes) to perform BIST operations.

For example, a multilane receiver system may include a first receiver lane and a second receiver lane, where the first receiver lane may be configured as a synthesized clock source and the second receiver lane may be configured to perform BIST operations. According to techniques described herein, the first receiver lane may transmit or pass clock information (e.g., TX clock information) to the second receiver lane for performing BIST operations. For example, the second receiver lane may transmit a BIST test data pattern using the TX clock received from the first receiver lane (e.g., the clock rate of the TX clock may be a function of the BIST test data pattern). The TX clock received by the second receiver lane (e.g., from the first receiver lane configured as the synthesized clock source) may be more accurate than the reference clock (Ref Clock) of the second receiver lane. Therefore, the second receiver lane may perform more efficient (e.g., accurate) BIST operations (e.g., such as performing offset calibrations using the TX clock) without a dedicated clock source, according to techniques described herein.

The embodiments of the present disclosure herein and the various features and advantageous details thereof are explained more fully with reference to the non-limiting embodiments of the present disclosure that are illustrated in the accompanying drawings and detailed in the following description. Descriptions of well-known components and processing techniques are omitted to not unnecessarily obscure the embodiments of the present disclosure. The examples used herein are intended merely to facilitate an understanding of ways in which the embodiments of the present disclosure may be practiced and to further enable those of skill in the art to practice the embodiments of the present disclosure. Accordingly, the examples should not be construed as limiting the scope of the embodiments of the present disclosure.

Referring to FIGS. 1 through 5, similar reference characters denote corresponding features throughout the figures.

FIG. 1 depicts a receiver lane of a receiver system 100 configured to perform BIST operations, wherein at least one receiver lane of the receiver system 100 can function as a synthesized clock source to other receiver lanes of the receiver system 100 performing BIST operations, according to embodiments of the present disclosure as disclosed herein. In an embodiment of the present disclosure, the receiver system 100 comprises of a plurality of receiver lanes. In an embodiment of the present disclosure, the receiver system 100 includes N receiver lanes labeled as receiver lane-0 through receiver lane-(N−1). For simplicity, a single detailed receiver lane (receiver lane-0) is depicted. The structures of the other receiver lanes may be the same as, or similar to, that of the receiver lane (receiver lane-0). In some examples, the receiver lane-0 can be referred to as the receiver system 100 (as a single receiver lane is depicted). In an example, the receiver system 100 can be included in a display system/panel of an electronic device such as, but not limited to a television, laptop, desktop, smartphone, a vehicle infotainment system, a Virtual Reality (VR) device, an Augmented Reality (AR) device, an Internet of Things (IoT) device, and so on.

In an example, the receiver system 100 can include 64 receiver lanes (e.g., N=64 receiver lanes). The plurality of receiver lanes may enable the utilization of the receiver system 100 in applications that supports a high throughput (such as high-speed gaming, High Definition (HD) television and Ultra HD television).

As depicted in FIG. 1, the receiver system 100 (receiver lane-0) comprises two blocks (e.g., a physical analog block 101, labeled as PHY ANA, and a physical-digital block 102, labeled as PHY digital). The physical analog block 101 comprises a Continuous Time Linear Equalizer (CTLE) 103, a Variable Gain Amplifier (VGA) 104, a summer 105, a Clock and Data Recovery (CDR) core 106, a deserializer 107, a serializer 108, and a termination block 109. The physical-digital block 102 comprises a multiplexer 110, a receiver BIST block 111 (labeled as RX BIST), and a pattern generator 112.

The receiver system 100 may receive signals transmitted by a transmitter. The received signals can be differential input signals (transmitted signals), which can be through the input terminals (rxd p and rxd n) of the receiver system 100. The output of the deserializer 107 is provided to the physical-digital block 102. The output of the deserializer 107 can be considered as the received data (labeled as RX-Data). The received data can be provided to upper layers (such as link layer), through the physical-digital block 102, and the multiplexer 110. The received data can be provided in parallel. In an example, the deserializer 107 can send 32 bits at the same time to the physical-digital block 102.

The physical-digital block 102 includes the pattern generator 112, which can generate test data patterns. The test data patterns generated by the pattern generator 112 can be sent to the serializer 108 of the physical analog block 101. In an embodiment of the present disclosure, the pattern generator 112 generates data bits/symbols in parallel. In an example, the pattern generator 112 can send 40 bits at the same time to the serializer 108. The serializer 108 and the pattern generator 112 can be considered as portions of an internal transmitter (TX) within the receiver system 100, which can be used for verifying (validating) the functionality of the receiver system 100.

The serializer 108 can serialize the parallel data sent by the pattern generator 112 and send the serialized data as internal transmitted data. The serializer 108 sends the internal transmitted data as a part of the BIST operation. The serializer 108 can utilize a transmitter clock (labeled as TX clock) for transmitting the serialized data. In an embodiment of the present disclosure, if the serializer 108 can receive the TX clock from a receiver lane of the receiver system 100. The receiver lane providing the TX clock acts as a synthesized clock source. The serializer 108 can send the internal transmitted data to at least one of the CTLE 103, the summer 105, and the multiplexer 110.

The receiver system 100 can operate in two modes (e.g., a functional mode and a BIST mode). In the functional mode, the receiver system 100 can receive data streams from a transmitter through the input terminals rxd p and rxd n. In the BIST mode, the functionality of the receiver system 100, to accurately receive data streams, is tested by performing the BIST operations. The pattern generator 112 (internal transmitter) generates a test data pattern, which may be locally received (received within the receiver system 100). In an embodiment of the present disclosure, the pattern generator 112 can provide the generated test data pattern to the receiver BIST block 111 through the multiplexer 110. The test data pattern (parallel data) is received by the serializer 108 (internal transmitter) and is serialized into high-speed data. The serialized data can be transmitted by the serializer 108 using a clock signal (TX clock), which may be generated by another receiver lane (receiver lane 0-(N−1)) of the receiver system 100.

A transmitter component (e.g., an internal transmitter) may include various components of a receiver system depending on an operation being performed by the receiver system. For example, in various embodiments described herein, a transmitter component may include a RX-CDR block, pattern generator, a BIST serializer block, etc. A transmitter component may transmit information and/or signals generated by the transmitter component itself, information and/or signals generated by the other components of the receiver system or both. Information sent by a transmitter component may be received from other components of the device. In some cases, transmitter component may be an example of aspects of a transceiver.

The serialized data (internally transmitted test data) can be sent to at least one of the CTLE 103, the summer 105, and the multiplexer 110, based on portions of the receiver lane-0 of the receiver system 100 to be tested (verified). If the internally transmitted test data is sent to the CTLE 103 (path labeled as C), some or all of the components of the receiver system 100 (physical analog block 101 and physical-digital block 102) can be tested. If the internally transmitted test data is sent to the summer 105 (path labeled as B), some components of the physical analog block 101 (e.g., the CTLE 103 and the VGA 104) may not be tested, while some or all of the components of the physical-digital block 102 can be tested. If the internally transmitted test data is sent to the multiplexer 110 (path labeled as A), the components of the physical analog block 101 cannot be tested, while some or all of the components of the physical-digital block 102 can be tested.

In an embodiment of the present disclosure, three BIST operations can be performed sequentially for testing various components (portions) of the receiver lane-0. In the first BIST operation, the internally transmitted test data can be sent to the CTLE 103. In the second BIST operation, the internally transmitted test data can be sent to the summer 105. In the third BIST operation, the internally transmitted test data can be sent to the multiplexer 110. It is to be noted that the testing of the components of the physical analog block 101 and the physical-digital block 102 can be performed in any sequence in terms of sending the internally transmitted test data to the CTLE 103, the summer 105, or the multiplexer 110.

The receiver lane-0 of the receiver system 100 (CTLE 103, the summer 105, or the multiplexer 110) can receive the internally transmitted test data. The internally transmitted test data can be deserialized by the deserializer 107 and provided to the multiplexer 110. The multiplexer 110 can provide the deserialized version of the internally transmitted test data to the receiver BIST block 111. The receiver BIST block 111 compares the deserialized version of the internally transmitted test data (received data pattern) with the test data pattern generated by the pattern generator 112. If it is determined, by the receiver BIST block 111, that the internally transmitted test data is matching the test data pattern generated by the pattern generator 112, the receiver BIST block 111 can verify the functionality of the receiver system 100 (receiver lane) to accurately receive data streams from the transmitter through the input terminals rxd p and rxd n.

In an embodiment of the present disclosure, at a particular instant, a receiver lane, amongst the plurality of receiver lanes, can act as a synthesized clock source. The receiver lane, acting as the synthesized clock source, can generate the TX clock. The receiver lane can provide the clock signal to the remaining at least one of the plurality of receiver lanes (including the receiver lane-0). In an example, if the receiver system 100 includes eight receiver lanes, one of the eight receiver lanes can generate a clock signal and provide the clock signal to the remaining at least seven of the eight receiver lanes. When the receiver lane, which had acted as the synchronized clock source by generating the clock signal, operates in the BIST mode, one of the other seven receiver lanes (which had operated in the BIST mode and received the clock signal) can act as the synchronized clock source by generating a clock signal and provide the clock signal to the receiver lane currently operating in the BIST mode.

FIG. 1 shows an embodiment of the receiver system 100, but it is to be understood that other embodiments of the present disclosure are not limited thereon. In other embodiments of the present disclosure, the receiver system 100 may include less or more number of units. Further, the labels or names of the units of the receiver system 100 are used only for illustrative purposes and do not limit the scope of the embodiments of the present disclosure. One or more units can be combined to perform the same or substantially similar function in the receiver system 100.

Figure 2:
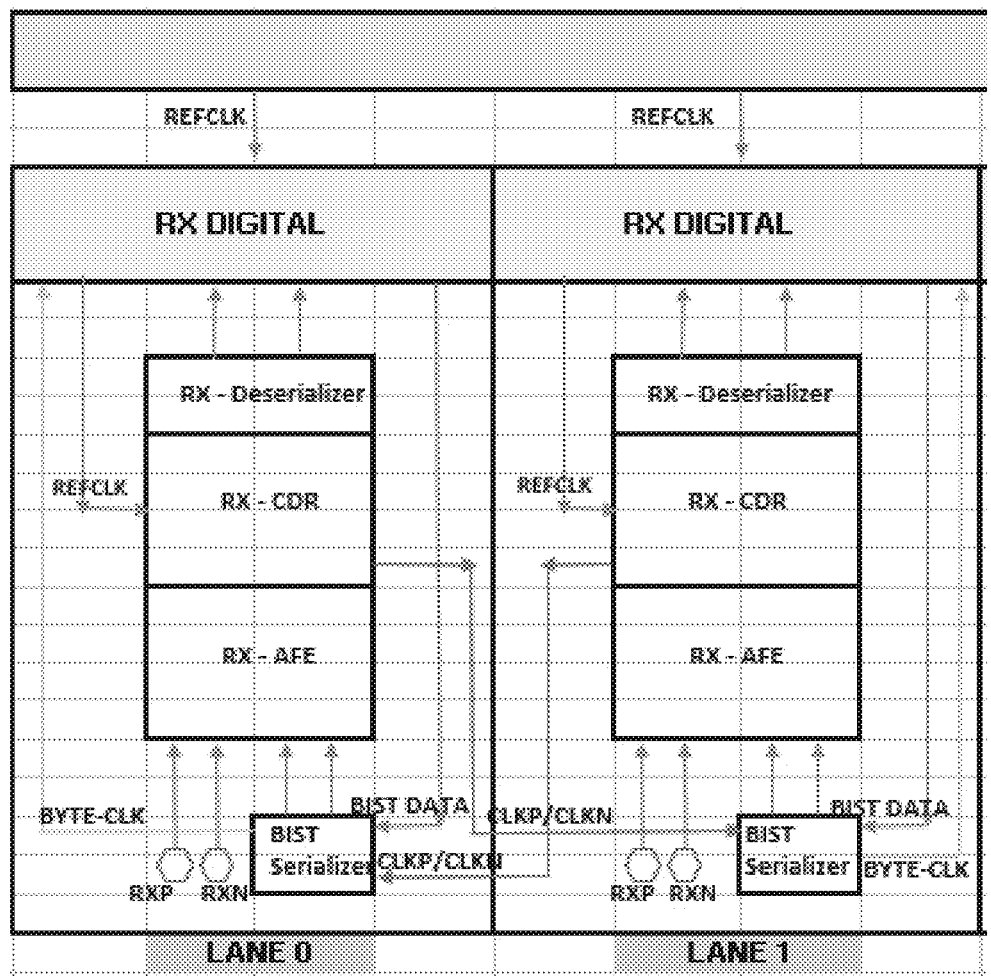
FIG. 2 is an example block level representation of the receiver system comprising two receiver lanes, wherein one of the receiver lanes is acting as a synthesized clock source to enable the other receiver lane to perform BIST operation, according to embodiments of the present disclosure as disclosed herein.

FIG. 2 is an example block level representation of the receiver system 100 comprising two receiver lanes, wherein one of the receiver lanes is acting as a synthesized clock source to enable the other receiver lane to perform BIST operation, according to embodiments of the present disclosure as described herein. As depicted in FIG. 2, the receiver system 100 includes of two receiver lanes (e.g., lane-0 and lane-1). At a particular instant, lane-0 can act as the synthesized clock source. The lane-0 can provide a TX clock with a high clock rate to lane-1. The receiver lane lane-1 can receive the TX clock from lane-0 and utilize the TX clock to internally test the functionality of the receiver lane-1 to receive data streams from transmitters through the input terminals RX-P and RX-N of lane-1. Similarly, if lane-1 is acting as the synthesized clock source, lane-1 can provide a TX clock with a high clock rate to lane-0. The receiver lane lane-0 can receive the TX clock from lane-1 and utilize the TX clock to internally test the functionality of the receiver lane lane-0 to receive data streams from transmitters through the input terminals RX-P and RX-N of lane-0.

The physical analog block 101 is depicted using four blocks including, for example, a RX-AFE block (comprising the CTLE 103, the VGA 104 and the termination block 109), a RX-CDR block (comprising the summer 105 and the CDR core 106), the RX-Deserializer block (deserializer 107) and the BIST serializer block (serializer 108).

The RX DIGITAL block is the physical-digital block 102 and includes the multiplexer 110, the receiver BIST block 111, and the pattern generator 112. The RX DIGITAL blocks of the receiver lanes (lane-0 and lane-1) can receive respective Reference Clocks (REF clock) from the receiver system 100 (the receiver system 100 can be referred as System on Chip (SoC)). In an embodiment of the present disclosure, the Reference Clocks pertaining to lane-0 and lane-1 may be the same as a SoC Reference Clock. In another embodiment of the present disclosure, the Reference Clocks pertaining to lane-0 and lane-1 may be different. The Reference Clocks pertaining to lane-0 and lane-1 can be a function of the SoC (receiver system 100) Reference Clock. In an embodiment of the present disclosure, the RX DIGITAL blocks of lane-0 and lane-1 can send the Reference Clocks pertaining to lane-0 and lane-1 to the respective RX-CDR blocks of lane-0 and lane-1. The BIST serializer blocks of lane-0 and lane-1 can send specific (or different) BYTE-CLK to the respective RX DIGITAL blocks of lane-0 and lane-1.

The receiver lanes (lane-0 and lane-1) can operate either in the functional mode or the BIST mode. In the functional mode, lane-0 and lane-1 receive data streams from a transmitter. If one of the receiver lanes is operating in the BIST mode, the other receiver lane can function as the synthesized clock source.

For example, if lane-0 is acting as the synthesized clock source, the functionality of lane-1 of the receiver system 100 to receive data streams can be verified. When lane-0 is acting as the synthesized clock source, the RX-CDR block of lane-0 provides the TX clock to the BIST serializer block of lane-1. The RX DIGITAL block of lane-1 provides BIST data to the BIST serializer block of lane-1. The pattern generator 112 in the RX DIGITAL block of lane-1 can generate test data patterns, which can be referred to as the BIST data. The pattern generator 112 in the RX DIGITAL block of lane-1 can provide the BIST data to the BIST serializer block of lane-1. The BIST serializer block of lane-1 can transmit the BIST data using the TX clock received from the RX-CDR block of lane-0.

The transmitted BIST data can be received by the RX-AFE block of lane-1. The output of the RX-CDR block of lane-1 can be considered as received test data. The received test data can be sent to the RX-Deserializer block of lane-1, wherein the received test data is deserialized. The RX-Deserializer block of lane-1 can send the deserialized version of the received test data to the RX DIGITAL block of lane-1. The RX DIGITAL block of lane-1 can compare the deserialized version of the received test data with the BIST data sent to the BIST serializer block of lane-1. If the comparison results in a match, the functionality of lane-1 to receive data streams from a transmitter is verified.

Similarly, if lane-1 is acting as the synthesized clock source, the functionality of lane-0 of the receiver system 100 to receive data streams can be verified. When lane-1 is acting as the synthesized clock source, the RX-CDR block of lane-1 provides the TX clock to the BIST serializer block of lane-0. The RX DIGITAL block of lane-0 provides BIST data to the BIST serializer block of lane-0. The pattern generator 112 in the RX DIGITAL block of lane-0 can generate test data patterns, which can be referred to as BIST data. The pattern generator 112 in the RX DIGITAL block of lane-0 can provide the BIST data to the BIST serializer block of lane-0. The BIST serializer block of lane-0 can transmit the BIST data using the TX clock received from the RX-CDR block of lane-1.

The transmitted BIST data can be received by the RX-AFE block of lane-0. The output of the RX-CDR block of lane-0 can be considered as received test data. The received test data can be sent to the RX-Deserializer block of lane-0, wherein the received test data is deserialized. The RX-Deserializer block of lane-0 can send the deserialized version of the received test data to the RX DIGITAL block of lane-0. The RX DIGITAL block of lane-0 can compare the received test data with the BIST data sent to the BIST serializer block of lane-0. If the comparison results in a match, the functionality of lane-0 to receive data streams from a transmitter is verified.

Figure 3:
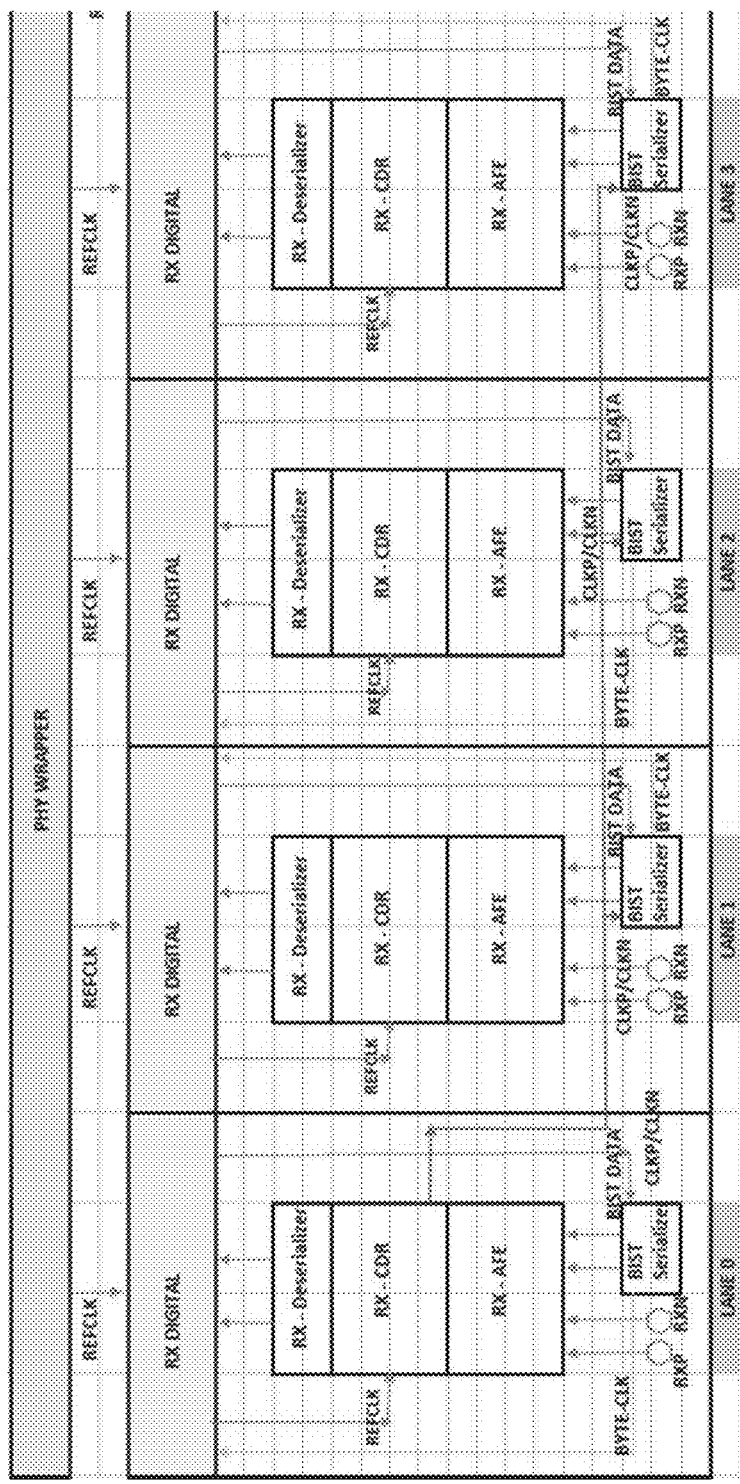
FIG. 3 is an example block level representation of the receiver system comprising four receiver lanes, wherein one of the four receiver lanes is acting as a synthesized clock source to enable the other three receiver lanes to perform BIST operations, according to embodiments of the present disclosure as disclosed herein.

FIG. 3 is an example block level representation of four receiver lanes of the receiver system 100, wherein one of the four receiver lanes is acting as a synthesized clock source to enable the other three receiver lanes to perform BIST operations, according to embodiments of the present disclosure as disclosed herein. As depicted in FIG. 3, the receiver system 100 comprises of four receiver lanes (e.g., lane-0 lane-1, lane-2 and lane-3). The lane-0 may act as the synthesized clock source, and provides a TX clock to receiver lanes lane-1, lane-2, and lane-3. The receiver lanes lane-1, lane-2, and lane-3, can utilize the TX clock to perform BIST operations individually for internal verification of the receiver functionalities of lane-1, lane-2, and lane-3 to receive data streams from transmitters through their respective input terminals RX-P and RX-N.

The RX-CDR block of lane-0 provides the TX clock to the BIST serializer blocks of lane-1, lane-2, and lane-3. The RX DIGITAL block of lane-1 provides BIST data to the BIST serializer block of lane-1. The RX DIGITAL block of lane-1 provides BIST data to the BIST serializer block of lane-1. The RX DIGITAL block of lane-2 provides BIST data to the BIST serializer block of lane-2. The RX DIGITAL block of lane-3 provides BIST data to the BIST serializer block of lane-3. Each of the pattern generators (112) in the RX DIGITAL blocks of lane-1, lane-2, and lane-3 can generate test data patterns (BIST data). The pattern generator 112 in the RX DIGITAL block of lane-1 can provide the BIST data to the BIST serializer block of lane-1. The pattern generator 112 in the RX DIGITAL block of lane-2 can provide the BIST data to the BIST serializer block of lane-2. The pattern generator 112 in the RX DIGITAL block of lane-3 can provide the BIST data to the BIST serializer block of lane-3.

The BIST serializer block of lane-1, lane-2, and lane-3, can transmit the BIST data, generated by the respective pattern generators 112 (RX DIGITAL blocks), using the TX clock received from the RX-CDR block of lane-0. The BIST data transmitted by the BIST serializer block of lane-1 can be received by the RX-AFE block of lane-1. The BIST data transmitted by the BIST serializer block of lane-2 can be received by the RX-AFE block of lane-2. The BIST data transmitted by the BIST serializer block of lane-3 can be received by the RX-AFE block of lane-3. The outputs of the RX-CDR blocks of lane-1, lane-2, and lane-3, can be considered as received test data.

The output (received test data) of the RX-CDR block of lane-1 can be sent to the RX-Deserializer block of lane-1, wherein the received test data is deserialized. The RX-Deserializer block of lane-0 can send the deserialized version of the received test data to the RX DIGITAL block of lane-O. The RX DIGITAL block of lane-1 can compare the received test data (deserialized version) with the BIST data sent to the BIST serializer block of lane-1. If the BIST data (sent to the BIST serializer block of lane-1) matches the received test data (received from the RX-Deserializer block of lane-1) the functionality of the lane-1 to receive data streams from a transmitter can be verified.

The output (received test data) of the RX-CDR block of lane-2 can be sent to the RX-Deserializer block of lane-2, wherein the received test data is deserialized. The RX-Deserializer block of lane-2 can send the deserialized version of the received test data to the RX DIGITAL block of lane-2. The RX DIGITAL block of lane-2 can compare the received test data (deserialized version) with the BIST data sent to the BIST serializer block of lane-2. If the BIST data (sent to the BIST serializer block of lane-2) matches the received test data (received from the RX-Deserializer block of lane-2) the functionality of the lane-2 to receive data streams from a transmitter can be verified.

The output (received test data) of the RX-CDR block of lane-3 can be sent to the RX-Deserializer block of lane-3, wherein the received test data is deserialized. The RX-Deserializer block of lane-3 can send the deserialized version of the received test data to the RX DIGITAL block of lane-3. The RX DIGITAL block of lane-3 can compare the received test data (deserialized version) with the BIST data sent to the BIST serializer block of lane-3. If the BIST data (sent to the BIST serializer block of lane-3) matches the received test data (received from the RX-Deserializer block of lane-3) the functionality of the lane-3 to receive data streams from a transmitter can be verified.

Figure 4:
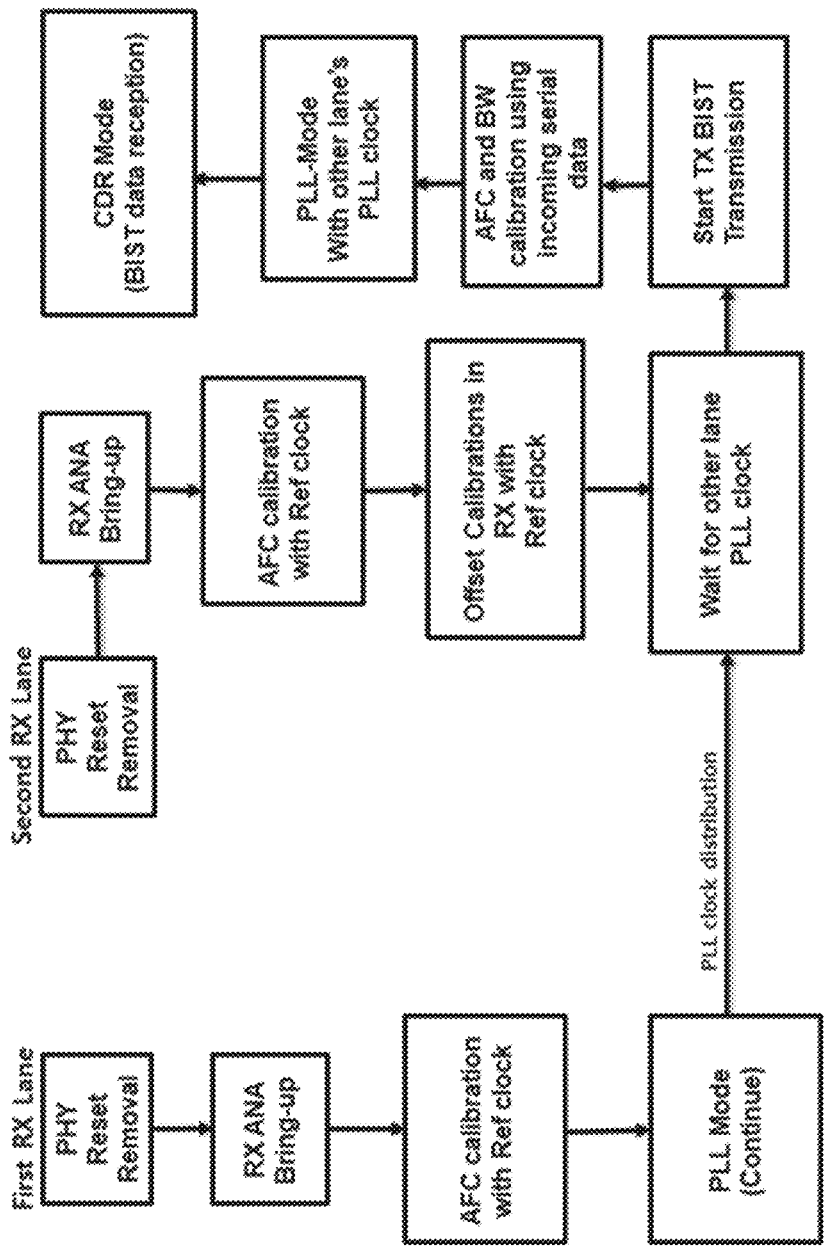
FIG. 4 is depicts a flow diagram for enabling a first receiver lane to function as a synthesized clock source and enabling a second receiver lane to perform a BIST operation through receiver lane bring-up, according to embodiments of the present disclosure as disclosed herein.

FIG. 4 depicts a flow diagram for enabling a first receiver lane to function as a synthesized clock source and enabling a second receiver lane to perform a BIST operation through receiver lane bring-up, according to embodiments of the present disclosure as disclosed herein. As depicted in FIG. 4, embodiments of the present disclosure enable the first receiver lane to function as the synthesized clock source if it is detected that the second receiver lane has initiated a BIST operation or if the second receiver lane is directed to perform the BIST operation. The RX DIGITAL block (physical-digital block 102) of the first receiver lane allows the first receiver lane to function as the synthesized clock source. The RX DIGITAL block of the second receiver lane allows the second receiver lane to perform the BIST operation. In an embodiment of the present disclosure, the configuration of the RX DIGITAL blocks of various receiver lanes of the receiver system 100 may be coordinated.

The embodiments of the present disclosure can be configured to follow a bring-up sequence, wherein there is a bring-up of the first receiver lane to function as the synthesized clock source and a bring-up of the second receiver lane to perform the BIST operation. The bring-up can refer to a process, wherein a series of control signals (such as power supply, enable, and so on) are provided to the first and second receiver lanes. The control signals may power the first and second receiver lanes of the receiver system 100 to function as the synthesized clock source and perform the BIST operation, respectively.

Control signals may include a chip select signal, a clock enable signal, a row address strobe signal, a write enable signal, and/or the like. In some examples, control signals may be transmitted and received in synchronization with a clock signal CLK.

In an embodiment of the present disclosure, consider that the first receiver lane is functioning as a Phase Locked Loop (PLL), i.e., the first receiver lane mimics a PLL. Thus, the PLL is the synthesized clock source. For both first and second receiver lanes, initially, there is PHY reset removal, wherein any existing reset in any of the physical analog block 101 and the physical-digital block 102, of each of the receiver lanes (first receiver lane and second receiver lane), is removed. The reset removal can be referred to as enabling the first receiver lane and the second receiver lane. The PHY reset removal can be followed by RX ANA bring-up. The RX ANA bring-up refers to the bring-up of the physical analog block 101 of each of the first receiver lane and the second receiver lane. The stages of PHY reset removal, and RX ANA bring-up involve waiting for the settling of internal biases in the components of the physical analog block 101 and the physical-digital block 102.

Thereafter, Automatic Frequency Calibration (AFC) of an internal Voltage Control Oscillator (VCO), in each of the first receiver lane and the second receiver lane is performed. The calibration is performed using the Ref Clocks of the first receiver lane and the second receiver lane, wherein the Ref Clock of the first receiver lane is provided by the RX-DIGITAL block of the first receiver lane and the Ref Clock of the second receiver lane is provided by the RX-DIGITAL block of the second receiver lane. Once the RX-AFE block of the first receiver lane is calibrated, the first receiver lane to begins to act as the synthesized clock source, i.e., PLL. The first receiver lane generates a TX clock and continues to act as the synthesized clock source (PLL). The first receiver lane configures the clock rate of the TX clock to match a data rate at which the BIST operation is performed by the second receiver lane.

On the other hand, after AFC calibration of the internal VCO in the second receiver lane, various offsets in at least one component of the physical analog block 101 of the second receiver lane can be calibrated. The at least one component includes the CTLE 103, the VGA 104, and the summer 105. In an embodiment of the present disclosure, the calibration is performed using the Ref Clock of the second receiver lane. The second receiver lane can receive the TX clock from the first receiver lane (acting as PLL).

Once the second receiver lane receives the TX clock from the first receiver lane (the first receiver lane distributes (sends) the TX clock to the second receiver lane (and other receiver lanes, if any)), the second receiver lane performs offset calibration of the physical analog block 101 and the physical-digital block 102 of the second receiver lane again. The TX clock received by the second receiver lane is more accurate than the Ref Clock of the second receiver lane. Therefore, the second receiver lane can perform the offset calibration again (using the TX clock).

Thereafter, the second receiver lane can initiate the BIST operation, wherein the second receiver lane internally (within the second receiver lane) transmits a BIST test data pattern (generated by the second receiver lane) using the TX clock, and verifies the receiver functionality if a locally received data pattern (received within the second receiver lane) matches the BIST test data pattern. The BIST operation is initiated by the second receiver lane transmitting the BIST test data pattern using the TX clock received from the first receiver lane. In an embodiment of the present disclosure, the clock rate of the TX clock is a function of the BIST test data pattern. The transmitted BIST test data can be received by the components of at least one of the physical analog block 101 and the physical-digital block 102 of the second receiver lane.

The embodiments of the present disclosure include performing AFC calibration of the internal VCO in the second receiver lane and bandwidth calibration using incoming serial data. The incoming serial data is the locally received data pattern, which may match the transmitted BIST test data for verification of the receiver functionality of the second receiver lane. Once AFC calibration and bandwidth calibration is completed, the second receiver lane operates in the PLL mode. In this mode, the second receiver lane can track the frequency of the incoming serial data (using the RX-AFE block or a combination of the CTLE 103, the VGA 104, the summer 105, and so on). Once the frequency of the incoming serial data is tracked, the second receiver lane operates in the CDR mode. Herein, the CDR core 106 of the RX-CDR block can adjust the phase of the incoming serial data. The RX-Deserializer block (deserializer 107) of the second receiver lane can deserialize the incoming serial data for comparison with the BIST test data, which was generated by the second receiver lane using the TX clock.

Figure 5:
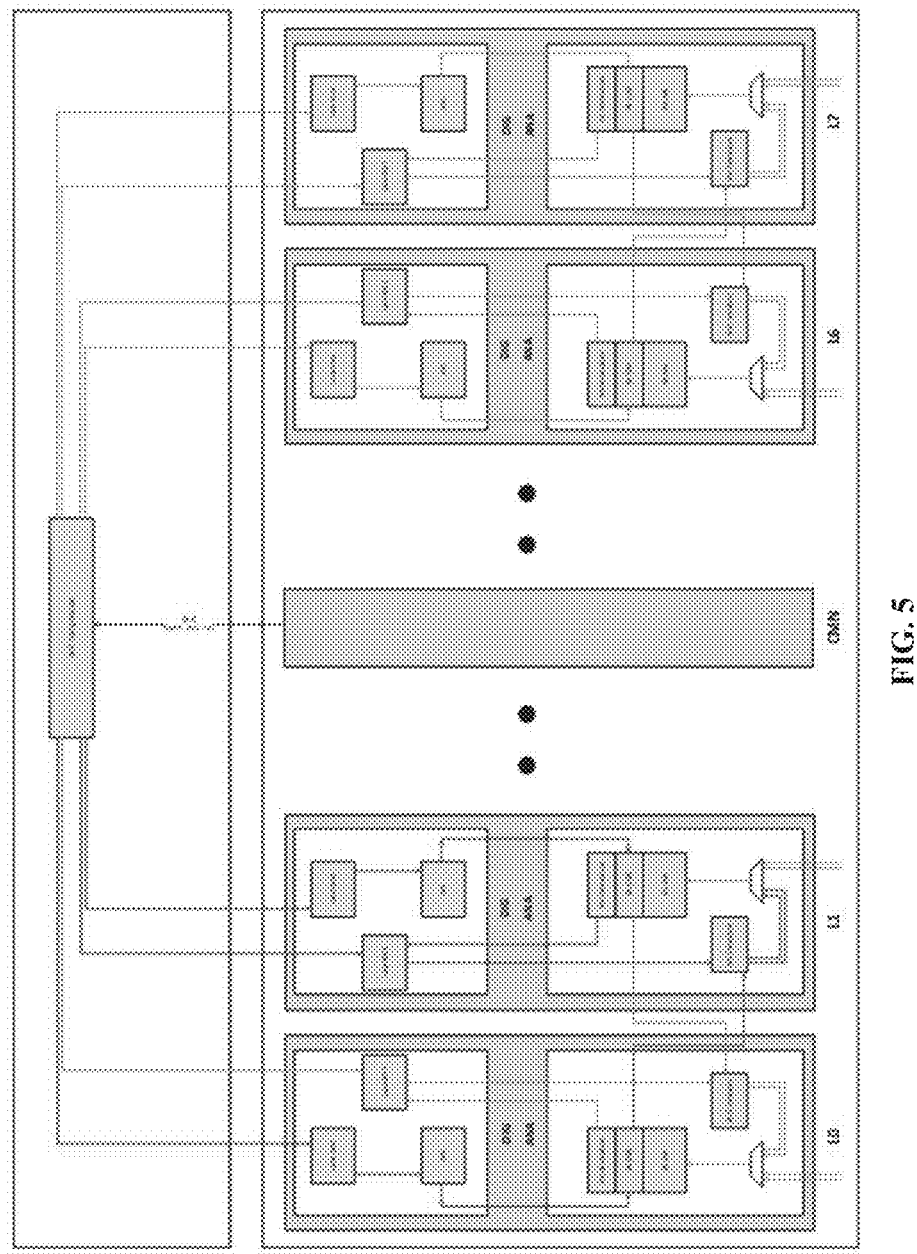
FIG. 5 depicts flow of signals through various units of individual physical analog blocks and physical-digital blocks of a plurality of receiver lanes of an example receiver system, according to embodiments of the present disclosure as disclosed herein.

FIG. 5 depicts flow of signals through various units of individual physical analog blocks (101) and physical-digital blocks (102) of a plurality of receiver lanes of an example receiver system 100, according to embodiments of the present disclosure as disclosed herein. As depicted in FIG. 5, there are eight receiver lanes (labeled as L0-L7). In the example arrangement, for every pair of adjacent receiver lanes, one of the receiver lanes in the pair is acting as the synthesized clock source when the other receiver lane of the pair is performing BIST operation. As the receiver system 100 includes eight receiver lanes, there are four pairs of adjacent receiver lanes in the the receiver system 100. In an embodiment of the present disclosure, the receiver system 100 further includes a BIST configuration decoder.

The BIST configuration decoder can provide a four bit digital input to the physical-digital blocks (102) (labeled as DIG) of every two adjacent receiver lanes. The BIST configuration decoder provides the same four bit digital input to the four pairs of adjacent receiver lanes. Based on the four bit digital input provided to the physical-digital blocks (102), each adjacent receiver lane pair of the receiver system 100 can act as the synthesized clock source and perform the BIST operation respectively.

In an embodiment of the present disclosure, the truth table of the operation of the eight receiver lanes either as the synthesized clock source or performing the BIST operation is depicted below (table 1).

TABLE 1

| Input | LANE 0 | LANE 1 | LANE 2 | LANE 3 | LANE 4 | LANE 5 | LANE 6 | LANE 7 |
|---|---|---|---|---|---|---|---|---|
| 0000 | Dis | Dis | Dis | Dis | Dis | Dis | Dis | Dis |
| 0001 | BIST | PLL | Dis | Dis | Dis | Dis | Dis | Dis |
| 0010 | PLL | BIST | Dis | Dis | Dis | Dis | Dis | Dis |
| 0011 | Dis | Dis | BIST | PLL | Dis | Dis | Dis | Dis |
| 0100 | Dis | Dis | PLL | BIST | Dis | Dis | Dis | Dis |
| 0101 | BIST | PLL | BIST | PLL | Dis | Dis | Dis | Dis |
| 0110 | PLL | BIST | PLL | BIST | Dis | Dis | Dis | Dis |
| 0111 | Dis | Dis | Dis | Dis | BIST | PLL | Dis | Dis |
| 1000 | Dis | Dis | Dis | Dis | PLL | BIST | Dis | Dis |
| 1001 | Dis | Dis | Dis | Dis | Dis | Dis | BIST | PLL |
| 1010 | Dis | Dis | Dis | Dis | Dis | Dis | PLL | BIST |
| 1011 | Dis | Dis | Dis | Dis | BIST | PLL | BIST | PLL |
| 1100 | Dis | Dis | Dis | Dis | PLL | BIST | PLL | BIST |
| 1101 | BIST | PLL | BIST | PLL | BIST | PLL | BIST | PLL |
| 1110 | PLL | BIST | PLL | BIST | PLL | BIST | PLL | BIST |
| 1111 | Dis | Dis | Dis | Dis | Dis | Dis | Dis | Dis |

The receiver lanes operating as synthesized clock sources are represented as PLL. The receiver lanes performing BIST operations are represented as BIST. The receiver lanes that are neither operating as synthesized clock source nor performing BIST operations are represented as Dis (Disabled).

The embodiments of the present disclosure disclosed herein can be implemented through at least one software program running on at least one hardware device and performing network management functions to control the network elements. The network elements shown in FIG. 3 include blocks which can be at least one of a hardware device, or a combination of hardware device and software module.

The embodiments of the present disclosure disclosed herein describe systems and methods for enabling a receiver system, comprising of a plurality of receiver lanes, to perform BIST operations. The embodiments of the present disclosure provide at least one receiver lane, amongst the plurality of receiver lanes, to act as a synthesized clock source to enable the at least one receiver lane to generate a clock signal and provide the clock signal to the other plurality of receiver lanes to perform the BIST operations. Since the receiver system does not include dedicated synthesized clock sources, chip area of the receiver system can be reduced considerably. In an example, for a 14 nm receiver system, the chip area can be reduced by 25% (compared to receiver systems including dedicated synthesized clock sources). The design effort of additional dedicated synthesized clock sources can be avoided. The avoidance of the dedicated synthesized clock sources (along with dedicated bumps) includes removing the requirement of having separate receiver lane. The power consumption of the receiver system reduces when the receiver lanes perform BIST operations. The reduction of power requirements includes lowering the power supply-induced noise in the receiver system. The design of the receiver system (with receiver lanes acting as synthesized clock sources for other receiver lanes performing BIST operations) can be generalized, and is, thus, independent of protocol (such as display protocols (DP, eDPRX and HDMI) and other SerDes receivers with CDR based architecture). The embodiments of the present disclosure eliminate the requirement of including additional supply/ground bumps as the receiver system does not include dedicated synthesized clock sources. The receiver lanes can be included of in V-by-One receiver system or a Display Port-embedded Display Port (DP-eDP) combo receiver system, wherein at least one receiver lane in the receiver systems acts as a synthesized clock source for adjacent receiver lanes performing BIST mode operations.

Therefore, it is understood that the scope of the protection is extended to such a program and in addition to a computer readable means having a message therein, such computer readable storage means contain program code means for implementation of one or more steps of the method, when the program runs on a server or mobile device or any suitable programmable device. The method is implemented in an embodiment of the present disclosure through or together with a software program written in example very high-speed integrated circuit Hardware Description Language (VHDL), or any other programming language, or implemented by one or more VHDL or several software modules being executed on at least one hardware device. The hardware device can be any kind of portable device that can be programmed.

The device may also include means, which could be, for example, a hardware means, for example, an application-specific Integrated Circuit (ASIC), or a combination of hardware and software means, for example, an ASIC and a Field Programmable Gate Array (FPGA), or at least one microprocessor and at least one memory with software modules located therein. The method embodiments of the present disclosure described herein could be implemented partly in hardware and partly in software. Additionally or alternatively, the embodiments of the present disclosure may be implemented on different hardware devices, e.g., using a plurality of Central Processing Units (CPUs).

A processor is an intelligent hardware device, (e.g., a general-purpose processing component, a digital signal processor (DSP), a central processing unit (CPU), a graphics processing unit (GPU), a microcontroller, an application-specific integrated circuit (ASIC), a field programmable gate array (FPGA), a programmable logic device, a discrete gate or transistor logic component, a discrete hardware component, or any combination thereof). In some cases, the processor is configured to operate a memory array using a memory controller. In other cases, a memory controller is integrated into the processor. In some cases, the processor is configured to execute computer-readable instructions stored in a memory to perform various functions. In some embodiments, a processor includes special purpose components for modem processing, baseband processing, digital signal processing, or transmission processing.

Examples of a memory device include random access memory (RAM), read-only memory (ROM), or a hard disk. Examples of memory devices include solid state memory and a hard disk drive. In some examples, memory is used to store computer-readable, computer-executable software including instructions that, when executed, cause a processor to perform various functions described herein. In some cases, the memory contains, among other things, a basic input/output system (BIOS) which controls basic hardware or software operation such as the interaction with peripheral components or devices. In some cases, a memory controller operates memory cells. For example, the memory controller can include a row decoder, column decoder, or both. In some cases, memory cells within a memory store information in the form of a logical state.

The foregoing description of the specific embodiments of the present disclosure will so fully reveal the general nature of the embodiments of the present disclosure that others can, by applying current knowledge, readily modify and/or adapt for various applications such specific embodiments of the present disclosure without departing from the generic concept, and, therefore, such adaptations and modifications should and are intended to be comprehended within the meaning and range of equivalents of the disclosed embodiments of the present disclosure. It is to be understood that the phraseology or terminology employed herein is for the purpose of description and not of limitation. Therefore, while the embodiments of the present disclosure have been described, those skilled in the art will recognize that the embodiments of the present disclosure can be practiced with modification within the scope of the present disclosure as described herein.

What is claimed is:

1. A method for performing a Built-In-Self-Test (BIST) operation, the method comprising:
    performing a first BIST operation by receiving, by a first receiver lane configured to receive transmitted data from a first lane via one or more first input terminals, a first transmitter (TX) clock from a second receiver lane configured to receive transmitted data from a second lane via one or more second input terminals, wherein the second receiver lane is configured to function as a synthesized clock source;
    transmitting, by a transmitter component of the first receiver lane, a test data sequence, wherein the test data sequence is generated based on a test data pattern and the first TX clock; and
    determining, by the first receiver lane, that the first BIST operation is successful if a received data sequence, received by at least one receiver component of the first receiver lane, is matching the test data sequence transmitted by the transmitter component.

2. The method of claim 1, wherein a clock rate of the first TX clock is controlled, by the second receiver lane, based on a data rate of the test data pattern set by the first receiver lane.

3. The method of claim 1, wherein the at least one receiver component of the first receiver lane receiving the test data sequence comprises a Continuous Time Linear Equalizer, a Variable Gain Amplifier, a summer, a Clock and Data Recovery, a deserializer, a multiplexer, a receiver BIST block, or some combination thereof.

4. The method of claim 1, wherein the first receiver lane and the second receiver lane are adjacent receiver lanes in a receiver system.

5. The method of claim 1, wherein a digital control signal configures the first receiver lane to perform the first BIST operation and the second receiver lane to function as the synthesized clock source.

6. The method of claim 1, further comprising:
    receiving, by the first receiver lane and the second receiver lane, a control signal from a BIST configuration decoder, wherein the control signal configures the first receiver lane to function as a second synthesized clock source and the second receiver lane to perform a second BIST operation;
    receiving, by the second receiver lane, a second TX clock from the first receiver lane;
    transmitting, by a second transmitter component of the second receiver lane, a second test data sequence generated based on a second test data pattern and the second TX clock received from the first receiver lane; and
    determining, by the second receiver lane, that the second BIST operation is successful if a second received data sequence, received by at least one receiver component of the second receiver lane, is matching the second test data sequence transmitted by the second transmitter component.

7. The method of claim 6, wherein a clock rate of the second TX clock is controlled, by the first receiver lane, based on a data rate of the second test data pattern set by the second receiver lane.

8. The method of claim 1, wherein the second receiver lane is configured to function as the synthesized clock source by functioning as a Phased Locked Loop (PLL).

9. A receiver system for performing a Built-In-Self-Test (BIST) operation, the receiver system configured to:
    perform a first BIST operation to receive, by a first receiver lane of the receiver system that is configured to receive transmitted data from a first lane via one or more first input terminals, a first transmitter (TX) clock from a second receiver lane of the receiver system that is configured to receive transmitted data from a second lane via one or more second input terminals, wherein the second receiver lane is configured to function as a synthesized clock source;
    transmit, by a transmitter component of the first receiver lane, a test data sequence, wherein the test data sequence is generated based on a test data pattern and the first TX clock; and
    determine, by the first receiver lane, that the first BIST operation is successful if a received data sequence, received by at least one receiver component of the first receiver lane, is matching the test data sequence transmitted by the transmitter component.

10. The receiver system of claim 9, wherein a clock rate of the first TX clock is controlled, by the second receiver lane, based on a data rate of the test data pattern sent by the first receiver lane.

11. The receiver system of claim 9, wherein the at least one receiver component of the first receiver lane receiving the test data sequence comprises a Continuous Time Linear Equalizer, a Variable Gain Amplifier, a summer, a Clock and Data Recovery, a deserializer, a multiplexer, a receiver BIST block, or some combination thereof.

12. The receiver system of claim 9, wherein the first receiver lane and the second receiver lane are adjacent receiver lanes in the receiver system.

13. The receiver system of claim 9, wherein a digital control signal configures the first receiver lane to perform the first BIST operation and the second receiver lane to function as the synthesized clock source.

14. The receiver system of claim 9, wherein the receiver system is further configured to:
  receive, by the first receiver lane and the second receiver lane, a control signal from a BIST configuration decoder, wherein the control signal configures the first receiver lane to function as a second synthesized clock source and the second receiver lane to perform a second BIST operation;
  receive, by the second receiver lane, a second TX clock from the first receiver lane;
  transmit, by a second transmitter component of the second receiver lane, a second test data sequence generated based on a second test data pattern and the second TX clock received from the first receiver lane; and
  determine, by the second receiver lane, that the second BIST operation is successful if a second received data sequence, received by at least one receiver component of the second receiver lane, is matching the second test data sequence transmitted by the second transmitter component.

15. The receiver system of claim 14, wherein a clock rate of the second TX clock is controlled, by the first receiver lane, based on a data rate of the second test data pattern set by the second receiver lane.

16. The receiver system of claim 9, wherein the second receiver lane is configured to function as the synthesized clock source by functioning as a Phased Locked Loop (PLL).

17. A method for performing Built-In-Self-Test (BIST) operations, the method comprising:
  performing a first BIST operation by receiving, by a plurality of receiver lanes of a receiver system configured to receive transmitted data from a first lane via one or more first input terminals, a transmitter (TX) clock from a separate receiver lane of the receiver system, wherein the separate receiver lane of the receiver system is configured to receive transmitted data from a second lane via one or more second input terminals, wherein the second receiver lane is configured to function as a clock source;
  transmitting, by transmitter components in each of the plurality of receiver lanes, test data sequences, wherein the test data sequences are generated based on a test data pattern and the TX clock; and
  determining whether the BIST operations performed by each of the plurality of receiver lanes are successful if received data sequences, received by at least one receiver component in each of the plurality of receiver lanes, is matching the test data sequences transmitted by the transmitter components in each of the plurality of receiver lanes.

18. The method of claim 17, wherein a clock rate of the TX clock is controlled, by the separate receiver lane acting as the clock source, based on data rates of the test data patterns set by each of the plurality of receiver lanes.

19. The method of claim 17, wherein the at least one receiver component in each of the plurality of receiver lanes comprises a Continuous Time Linear Equalizer, a Variable Gain Amplifier, a summer, a Clock and Data Recovery, a deserializer, a multiplexer, a receiver BIST block, or some combination thereof, in each of the plurality of receiver lanes.

20. The method of claim 17, wherein the plurality of receiver lanes and the separate receiver lane are adjacent receiver lanes in a receiver system, and wherein a digital control signal configures the plurality of receiver lanes to perform the BIST operation and the separate receiver lane to function as the clock source.

* * * * *